(12) United States Patent
Hwang

(10) Patent No.: US 6,478,622 B1
(45) Date of Patent: Nov. 12, 2002

(54) SMALL FORM-FACTOR PLUGGABLE TRANSCEIVER CAGE

(75) Inventor: Jeng-Yih Hwang, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/996,123

(22) Filed: Nov. 27, 2001

(51) Int. Cl.[7] .............................................. H01R 13/648
(52) U.S. Cl. ........................ 439/607; 439/939; 385/92
(58) Field of Search ................................ 439/607–610, 439/92, 95, 939; 355/92, 88, 89; 361/752, 756, 802

(56) References Cited

U.S. PATENT DOCUMENTS

| | | | | |
|---|---|---|---|---|
| 5,178,562 A | * | 1/1993 | Ermini | 439/609 |
| 5,317,105 A | * | 5/1994 | Weber | 439/939 |
| 5,913,698 A | * | 6/1999 | Keng | 439/939 |
| 6,066,001 A | * | 5/2000 | Liptak et al. | 439/607 |
| 6,095,862 A | * | 8/2000 | Doye et al. | 439/607 |
| 6,139,367 A | * | 10/2000 | Yeh | 439/609 |
| 6,227,880 B1 | * | 5/2001 | Zhu et al. | 439/92 |
| 6,231,385 B1 | * | 5/2001 | Kuo | 439/939 |

* cited by examiner

Primary Examiner—Gary F. Paumen
(74) Attorney, Agent, or Firm—Wei Te Chung

(57) ABSTRACT

An SFP transceiver cage includes a mainframe and a rectangular grounding device. The mainframe includes two sidewalls, a sidewall cover, a top plate, a bottom wall and a rear cover. The mainframe and grounding device are each preferably made from a single piece of metal plate. A plurality of inward fingers is formed on the mainframe. A plurality of outward grounding fingers is formed on the grounding device. A central outward spring tab is formed at the bottom of the grounding device. A front portion of the mainframe is mounted in an opening of an orthogonal panel, leaving a gap between the panel and the mainframe. The grounding device is mounted around the front portion of the mainframe, and substantially fits the gap. The central outward finger shields a gap between the panel and a spring latch of the mainframe.

1 Claim, 11 Drawing Sheets

SMALL FORM-FACTOR PLUGGABLE TRANSCEIVER CAGE

BACKGROUND OF THE INVENTION

1. Field of the Invention

The present invention relates to an optical transceiver cage, and more particularly to a small form-factor pluggable (SFP) transceiver cage of a high data transfer rate program gigabit interface converter (GBIC).

2. Description of the Related Art

Transceiver modules provide bi-directional transmission of data between an electrical interface and an optical data link. The module receives electrically encoded data signals and converts them into optical signals which are then transmitted over the optical data link. The module also receives optically encoded data signals, converts them into electrical signals, and transmits the electrical signals to the electrical interface.

Normally, the transceiver module is mounted on a printed circuit board (PCB) assembly of a host computer, an input/output system, a peripheral device, or a switch. An SFP transceiver module connects into a metal cage assembly mounted on the PCB. The metal cage generally has two parallel sidewalls, a rectangular top, a rectangular bottom, and front and rear ends. The metal cage provides easy interconnection, and is easily installed on the PCB. The cage functions to dissipate electrostatic buildup, and serves as an electromagnetic shield.

A conventional cage has an entrance portion that is mounted in an opening of an orthogonal panel. A plurality of outwardly projecting grounding tabs adjacent the entrance portion of the cage abuts against edges of the panel that bound the opening. The cage further includes a spring latch at the entrance portion, for contacting an SFP transceiver module. The spring latch is partially received in the opening. A gap exists between the spring latch and an edge of the panel that bounds the opening. In use, electromagnetic interference (EMI) passes through the gap. The cage does not provide adequate protection for the connecting interface from EMI.

In addition, there are no structures specifically for ground contacting a housing of the SFP transceiver module that is engaged in the cage. Furthermore, the cage forms legs for supporting the cage on the PCB, but there is no board locking mechanism to safeguard reflowing of solder during soldering of the cage to the PCB. The cage is liable to disengage from the PCB, causing poor soldering.

SUMMARY OF THE INVENTION

Accordingly, an object of the present invention is to provide an SFP transceiver cage that gives excellent protection from EMI when the cage is mounted to a panel.

Another object of the present invention is to provide an SFP transceiver cage which has a plurality of outward and inward grounding fingers to facilitate grounding and prevent EMI.

A further object of the present invention is to provide an SFP transceiver cage having legs that enable the cage to be locked on a PCB during soldering of the cage to the PCB.

A still further object of the present invention is to provide a sturdy SFP transceiver cage that is easily and inexpensively made essentially from a single metal plate.

To achieve the above objects, an SFP transceiver cage in accordance with a preferred embodiment of the present invention comprises a mainframe and a rectangular grounding device mounted around a front portion of the mainframe. The mainframe includes two sidewalls, a sidewall cover, a top plate, a bottom wall and a rear cover. The mainframe and grounding device are each preferably made from a single piece of metal plate. A plurality of inward grounding fingers are formed on a top, bottom and sides of a front portion of the mainframe. A plurality of outward grounding fingers are formed on a top, bottom and sides of the grounding device, symmetrically opposite the inward grounding fingers of the mainframe. A central outward spring tab is formed at the bottom of the grounding device.

A plurality of compliant legs, needle eye legs and support legs depends from the sidewalls of the mainframe. The compliant and needle eye legs are extended through corresponding holes defined in a PCB. The compliant and needle eye legs prevent the cage from moving relative to the PCB during the course of solder reflowing. The support legs abut a face of the PCB. The support legs serve as standoffs, separating the cage from the PCB to facilitate accurate soldering.

A front portion of the mainframe is mounted in an opening of an orthogonal panel, leaving a gap between the panel and the mainframe. The grounding device is mounted around the front portion of the mainframe, and substantially fits the gap. The outward grounding fingers of the grounding device engage with edges of the panel that surround the opening. The central outward spring tab serves as an EMI shield for any EMI that may pass through a gap existing between the panel and a spring latch of the mainframe. An SFP transceiver module is mounted into the cage having a conductive outer surface. The inward grounding fingers project into the cage contacting the conductive outer surface. The inward and outward grounding fingers and central outward spring tab cooperate to establish multiple electrical paths between the corresponding SFP transceiver module and the mainframe, grounding device and panel.

Other objects, advantages and novel features of the present invention will be apparent from the following detailed description of preferred embodiments thereof with reference to the attached drawings, in which:

DETAILED DESCRIPTION OF THE PREFERRED EMBODIMENTS

Figure 1:
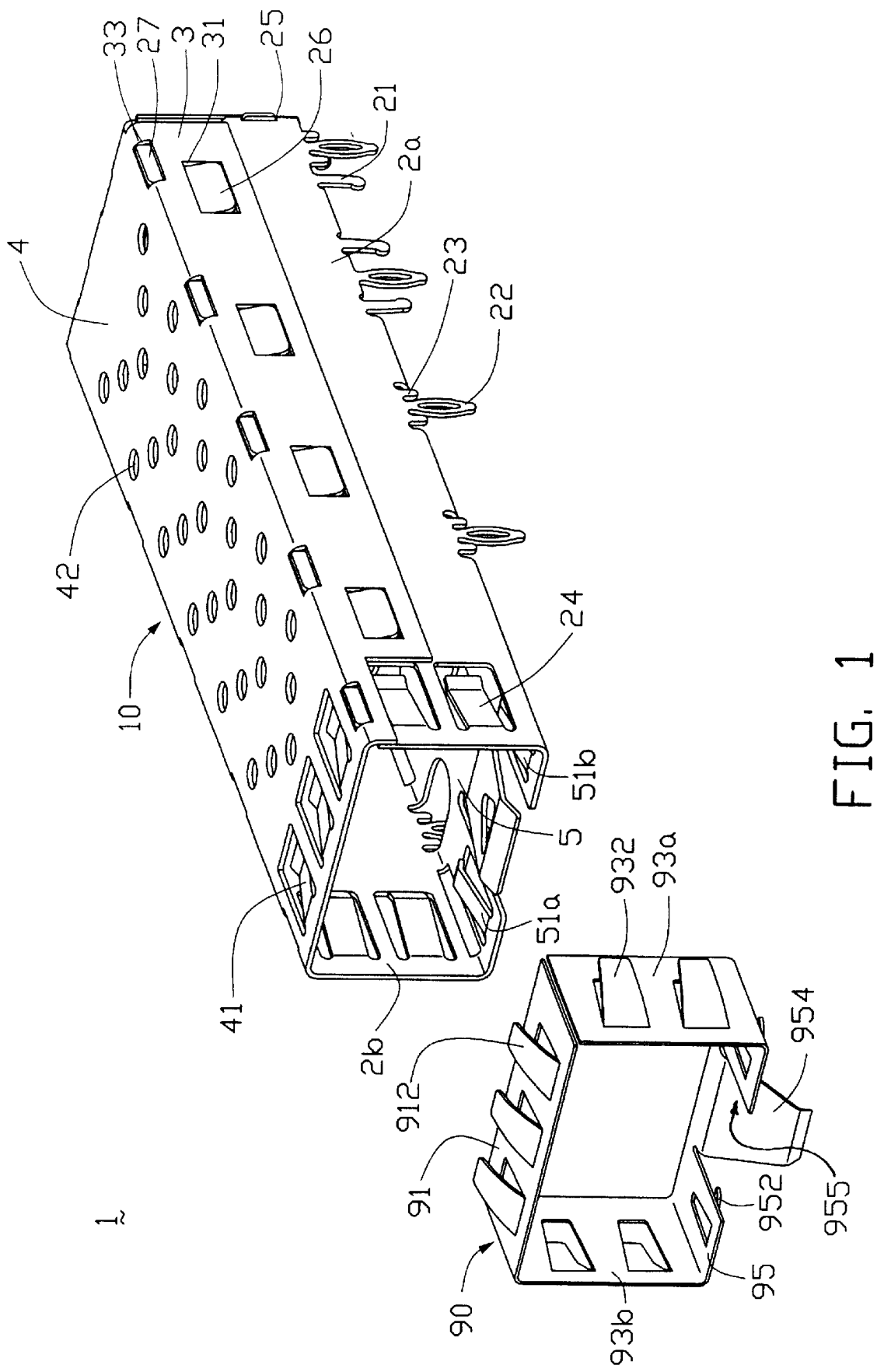
FIG. 1 is an exploded view of an SFP transceiver cage in accordance with a preferred embodiment of the present invention.
Figure 2:
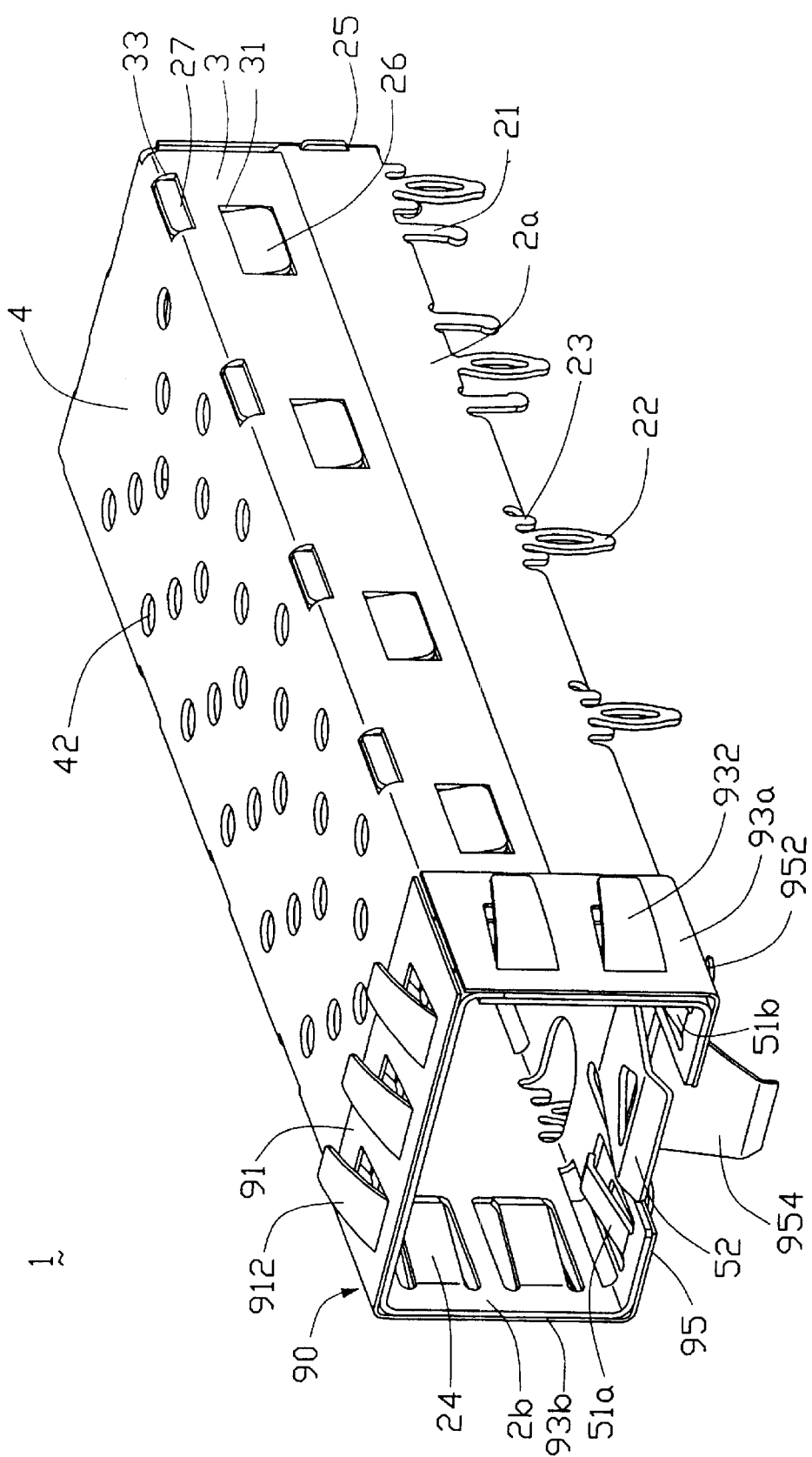
FIG. 2 is an assembled view of FIG. 1.
Figure 3:
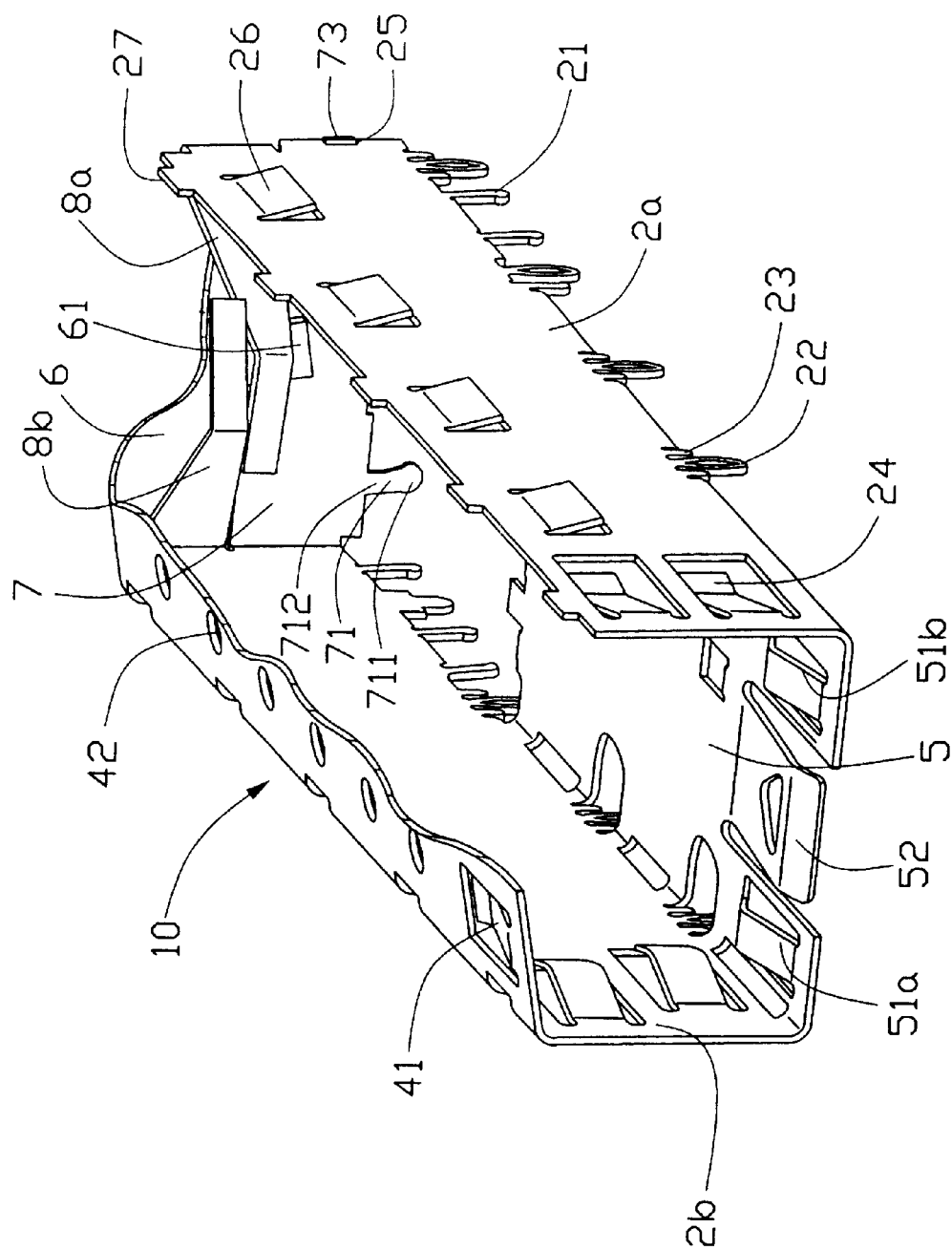
FIG. 3 is a perspective view of a mainframe of the cage of FIG. 1, showing the mainframe prior to its assembly, and with a portion of the mainframe cut away for clarity.

Referring to FIGS. 1–3, a small form-factor pluggable (SFP) transceiver cage 1 in accordance with a preferred embodiment of the present invention comprises a mainframe 10 and a rectangular grounding device 90. The mainframe 10 comprises a first sidewall 2a, a second sidewall 2b, a sidewall cover 3, a top plate 4, a bottom wall 5, a rear cover, and two spring arms 8a, 8b. The rear cover includes an outer plate 6 and an inner plate 7. The mainframe 10 is generally parallelepiped, and preferably made from a single piece of blank material such as a metal plate. The mainframe 10 may alternatively be made from two pieces of blank material. The grounding device 90 is preferably made from a single piece of blank material such as a metal plate, and is mounted around a front portion of the mainframe 10.

Each sidewall 2a, 2b forms two inward grounding fingers 24 proximate a front end thereof, and a plurality of compliant legs 21, needle eye legs 22 and support legs 23 depending from a lower edge thereof. The first sidewall 2a also forms a plurality of resilient clasps 26 along an upper portion thereof, and a plurality of locating tabs 27 along a top edge thereof. A small notch 25 is defined in a rear edge of the first sidewall 2a. The spring arms 8a, 8b inwardly extend generally perpendicularly from rear edges of the first and second sidewalls 2a, 2b respectively.

The sidewall cover 3 extends from the top plate 4 and overlaps the first sidewall 2a. A plurality of windows 31 are defined in the sidewall cover 3, for engagingly receiving the clasps 26 of the first sidewall 2a. A plurality of rectangular slots 33 are defined in a junction of the sidewall cover 3 and the top plate 4, for engagingly receiving the locating tabs 27 of the first sidewall 2a. The top plate 4 forms three inward grounding fingers 41 at a front portion thereof. A plurality of holes 42 is defined in middle and rear portions of the top plate 4.

Figure 4:
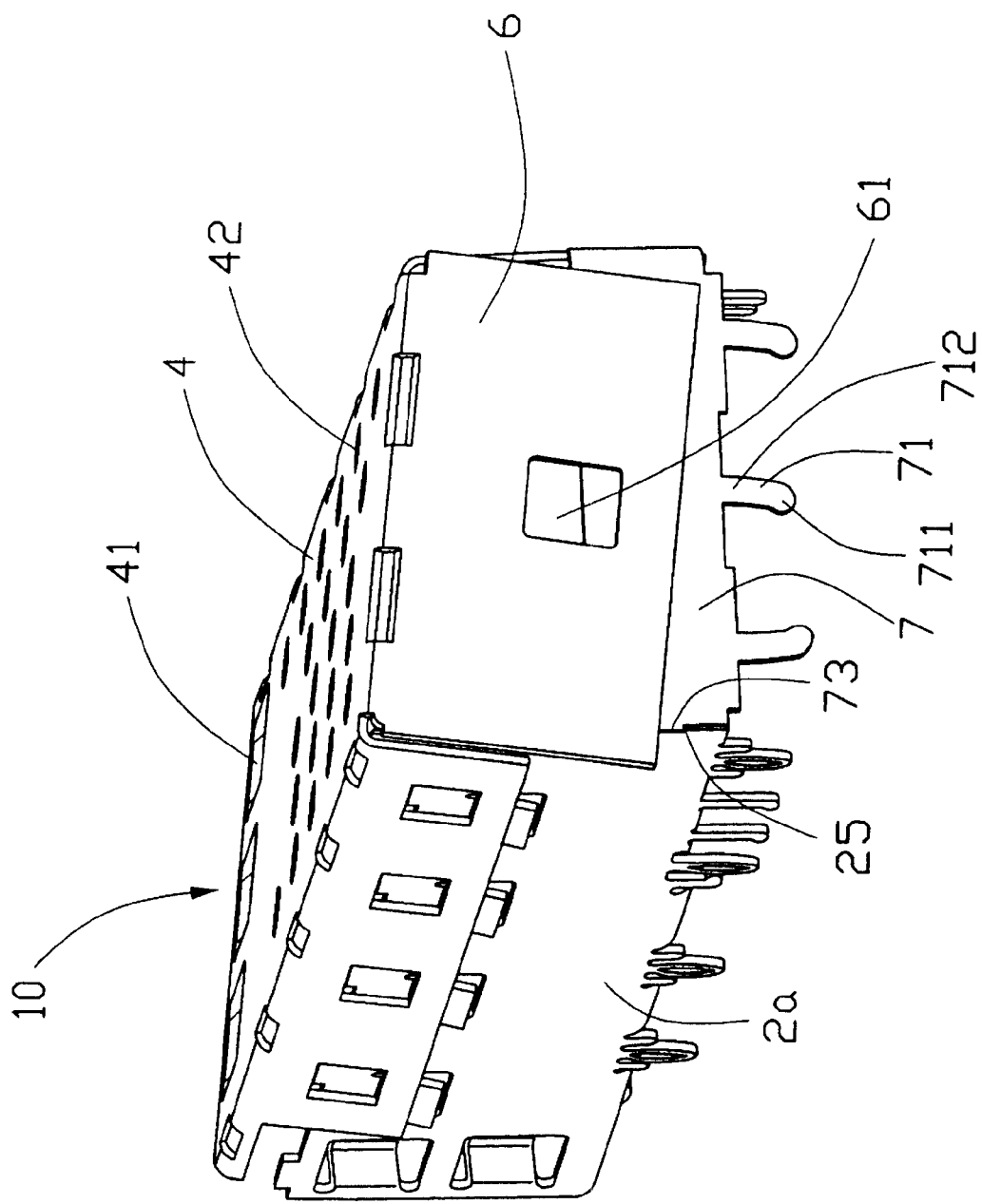
FIG. 4 is a perspective view of the mainframe of the cage of FIG. 1, showing the mainframe prior to its assembly, and viewed from a rear aspect.
Figure 5:
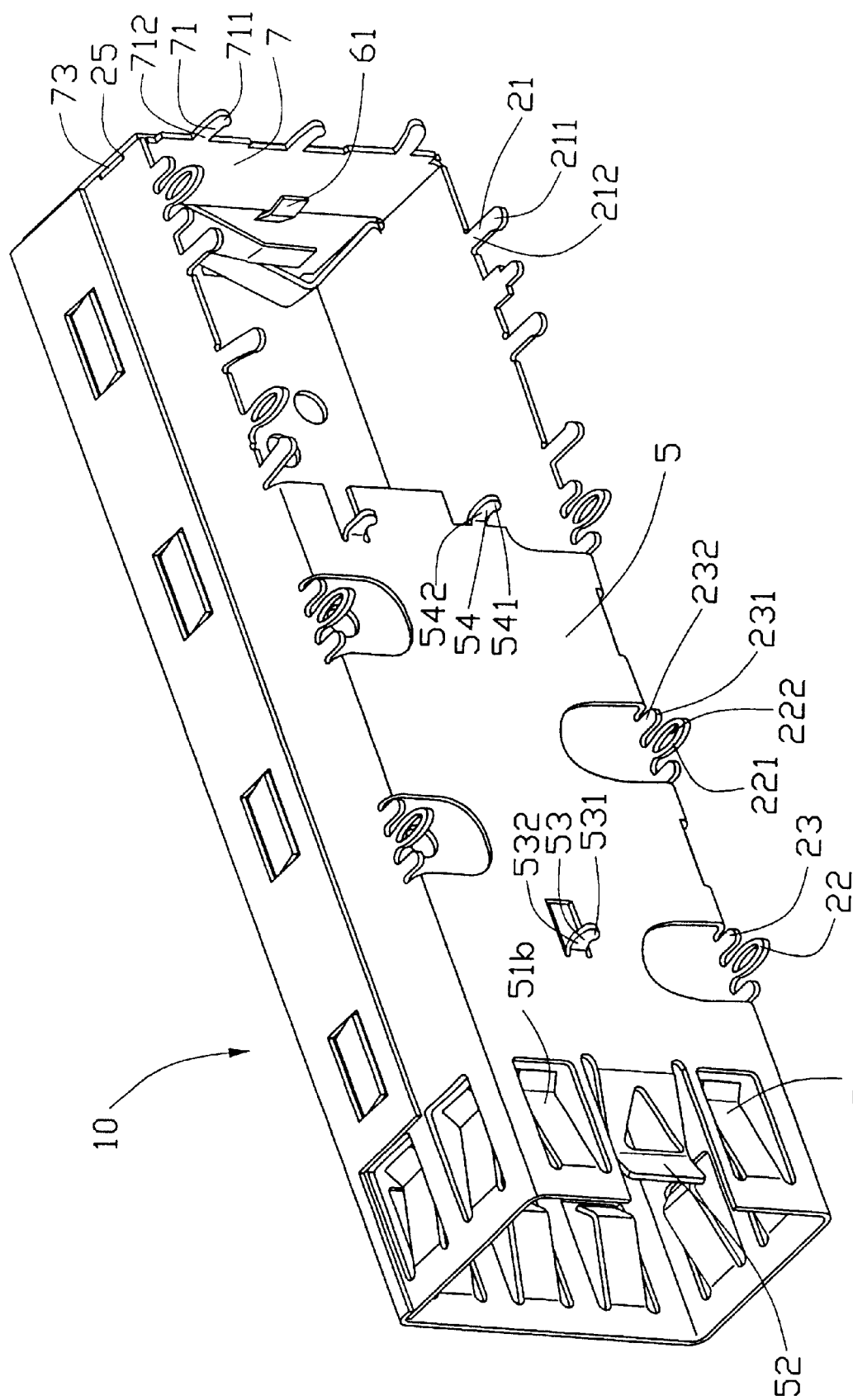
FIG. 5 is a perspective view of the mainframe of the cage of FIG. 1, but viewed from a bottom aspect.

Referring to FIGS. 3–5, the outer plate 6 of the rear cover extends from the top plate 4. An inward spring tab 61 extends from an inner face of the outer plate 6, for engaging the inner plate 7. The inner plate 7 extends from the second sidewall 2b. A plurality of compliant legs 71 depend from a lower edge of the inner plate 7. A projection 73 is formed at a free end of the inner plate 7, for engaging in the notch 25 of the first sidewall 2a.

The bottom wall 5 is shorter than the top plate 4. A central spring latch 52 is formed in a front portion of the bottom wall 5. The spring latch 52 extends slightly inwardly toward a middle of the mainframe 10, for engaging with a corresponding SFP transceiver module 400 (see FIG. 11). Two inward grounding fingers 51a, 51b are formed in a front portion of the bottom wall 5, on opposite sides of the spring latch 52 respectively. A distance between the two inward grounding fingers 51a, 51b is greater than a distance between the two inward grounding fingers 24 on the first sidewall 2a, and greater than a distance between the two inward grounding fingers 24 on the second sidewall 2b. This ensures that the spring latch 52 has sufficient elastic strength. A central compliant leg 53 depends from the bottom wall 5 rearward of the spring latch 52. Two rear compliant legs 54 depend from near a rear edge of the bottom wall 5.

The compliant legs 21, needle eye legs 22 and support legs 23 are all substantially co-planar with their respective corresponding sidewalls 2a, 2b. Each compliant leg 21, 53, 54, 71 respectively depending from the sidewalls 2a, 2b, bottom wall 5 and inner panel 7 comprises an elongate body 212, 532, 542, 712 and an offset rounded end 211, 531, 541, 711. The offset rounded end 211 is offset such that it slightly extends either toward a front of the mainframe 10, or toward a rear of the mainframe 10. Differently, each offset rounded end 531, 541, 741 is offset such that it slightly extends either toward the first sidewall 2a, or toward the second sidewall 2b. Each needle eye leg 22 comprises an elliptical body 221, and an elliptical hole 222 defined in a middle of the elliptical body 221. A width of the elliptical body 221 is dimensioned so that the needle eye leg 22 can press-fit into a corresponding hole defined in a printed circuit board (PCB) 300 (see FIG. 6). Each support leg 23 comprises an elongate body 232, and a rounded end 231.

Referring back again to FIGS. 1 and 2, the grounding device 90 includes a top cover 91, a bottom plate 95 opposite to the top cover 91, and first and second parallel sidewalls 93a, 93b positioned between the top cover 91 and bottom plate 95. The second sidewall 93b is integrally connected to both the top cover 91 and the bottom plate 95. The first sidewall 93a is integrally connected only to the bottom plate 95. Three outward grounding fingers 912 are formed on the top cover 91. Two outward grounding fingers 932 are formed on each sidewall 93a, 93b. Two outward grounding fingers 952 are formed on the bottom plate 95. A central outward spring tab 954 is formed in a middle portion of the bottom plate 95. A relative large space 955 is formed in the middle portion of the bottom plate 95 above the spring tab 954 for allowing the distal free end of the latch 52 to be moveable therein. The outward grounding fingers 952 are disposed on opposite sides of the central outward spring tab 954 respectively.

In assembly of the mainframe 10, the projection 73 of the inner plate 7 is engaged in the notch 25 of the first sidewall 2a. The top plate 4 and side cover 3 are bent such that the side cover 3 is fastened over first sidewall 2a. The inward spring tab 61 of the outer plate 6 engages the inner plate 7, thereby fixing the outer plate 6 in place. The clasps 26 of the first sidewall 2a are engaged in the windows 31 of the side cover 3. The locating tabs 27 of the first sidewall 2a are engaged in the rectangular slots 33. The sidewall cover 3 is thereby secured to the first sidewall 2a, forming the mainframe 10. The spring arms 8a, 8b and are located above the inner plate 7. The spring arms 8a, 8b facilitate resilient ejection of the corresponding SFP transceiver module from the mainframe 10.

In assembly of the cage 1, the grounding device 90 is mounted around the front portion of the mainframe 10. This is done by conventional means such as spot welding or adhesion. Alternatively, the grounding device 90 may be hooked onto the front portion of the mainframe 10 using hooks (not shown). Each outward finger 912, 932, 952 of the grounding device 90 is disposed symmetrically opposite a corresponding inward grounding finger 41, 24, 51a, 51b respectively of the top plate 4, sidewalls 2a, 2b and bottom wall 5 of the mainframe 10. The central outward spring tab 954 is disposed under the spring latch 52 of the bottom wall 5. A free end of the central outward spring tab 954 is disposed below a front of the cage 1.

Figure 6:
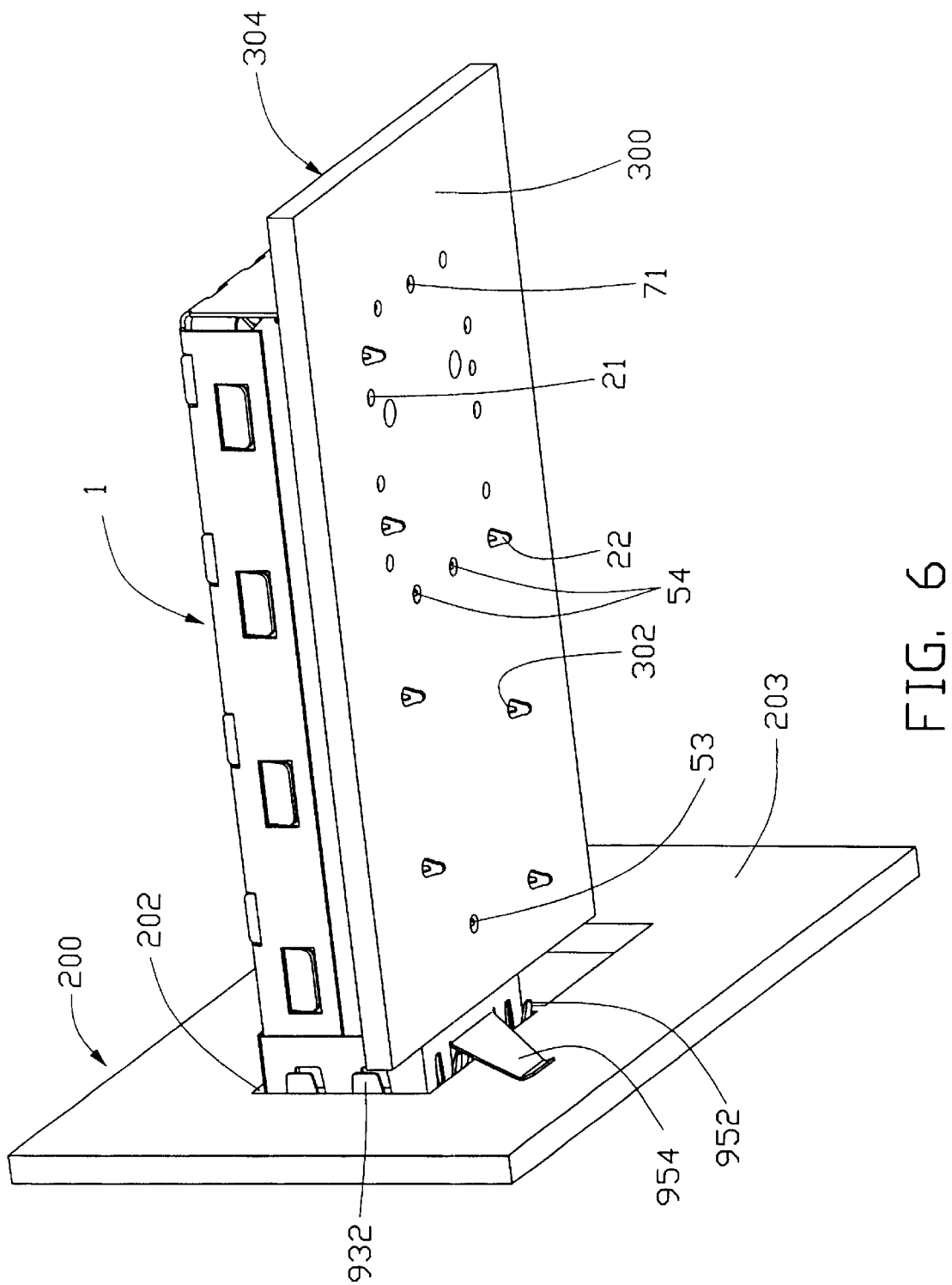
FIG. 6 shows the cage of FIG. 2 mounted on a printed circuit board, and further mounted in an opening of an orthogonal panel.

Referring particularly to FIGS. 5 and 6, in mounting the cage 1 to the PCB 300, the compliant legs 21, 53, 54, 71 and needle eye legs 22 are extended through corresponding holes 302 defined in the PCB 300. The offset rounded ends 211, 531, 541, 711 of the compliant legs 21, 53, 54, 71 resiliently press against the PCB 300 in the corresponding holes 302 wherein at least a pair of rounded ends are directed to opposite directions to respectively engage the opposite edges of the corresponding holes for obtaining a balanced retention. The needle eye legs 22 are press-fitted into the corresponding holes 302 of the PCB 300. The support legs 23 abut a top face 304 of the PCB 300. The offset rounded ends 211, 531, 541, 711 respective of the compliant legs 21, 53, 54, 71 and the elliptical bodies 221 of the needle eye legs 22 lock the cage 1 on the PCB 300. Thus the cage 1 can be firmly and stably secured on the PCB 300 with or without soldering. If the cage 1 is secured on the PCB 300 with soldering, the compliant legs 21, 53, 54, 71 and needle eye legs 22 prevent the cage 1 from moving relative to the PCB 300 during the course of solder reflowing. Furthermore the support legs 23 serve as standoffs, separating the cage 1 from the PCB 300 to facilitate accurate soldering.

In use, the combined cage 1 and PCB 300 is attached to a panel 200. The panel 200 defines at least one opening 202, and is orthogonal to the PCB 300. The front portion of the mainframe 10 with the grounding device 90 is inserted into the opening 202 of the panel 200. The outward grounding fingers 912, 932, 952 of the grounding device 90 resiliently abut against corresponding edges (not labeled) of the panel 200 that surround the opening 202. The central outward spring tab 954 resiliently abuts against an inner face 203 of the plate 200. A gap (not labeled) is defined between the spring latch 52, the grounding fingers 51*a*, 51*b* and a bottom edge of the panel 200 that bounds the opening 202. The central outward spring tab 954 serves as an electromagnetic interference (EMI) shield for any EMI that may pass through the gap. At the same time, the central outward spring tab 954 provides sufficient space for the spring latch 52 to move down and up during engagement and disengagement of the corresponding SFP transceiver module 400 (see FIG. 11) in and from the cage 1.

Figure 10:
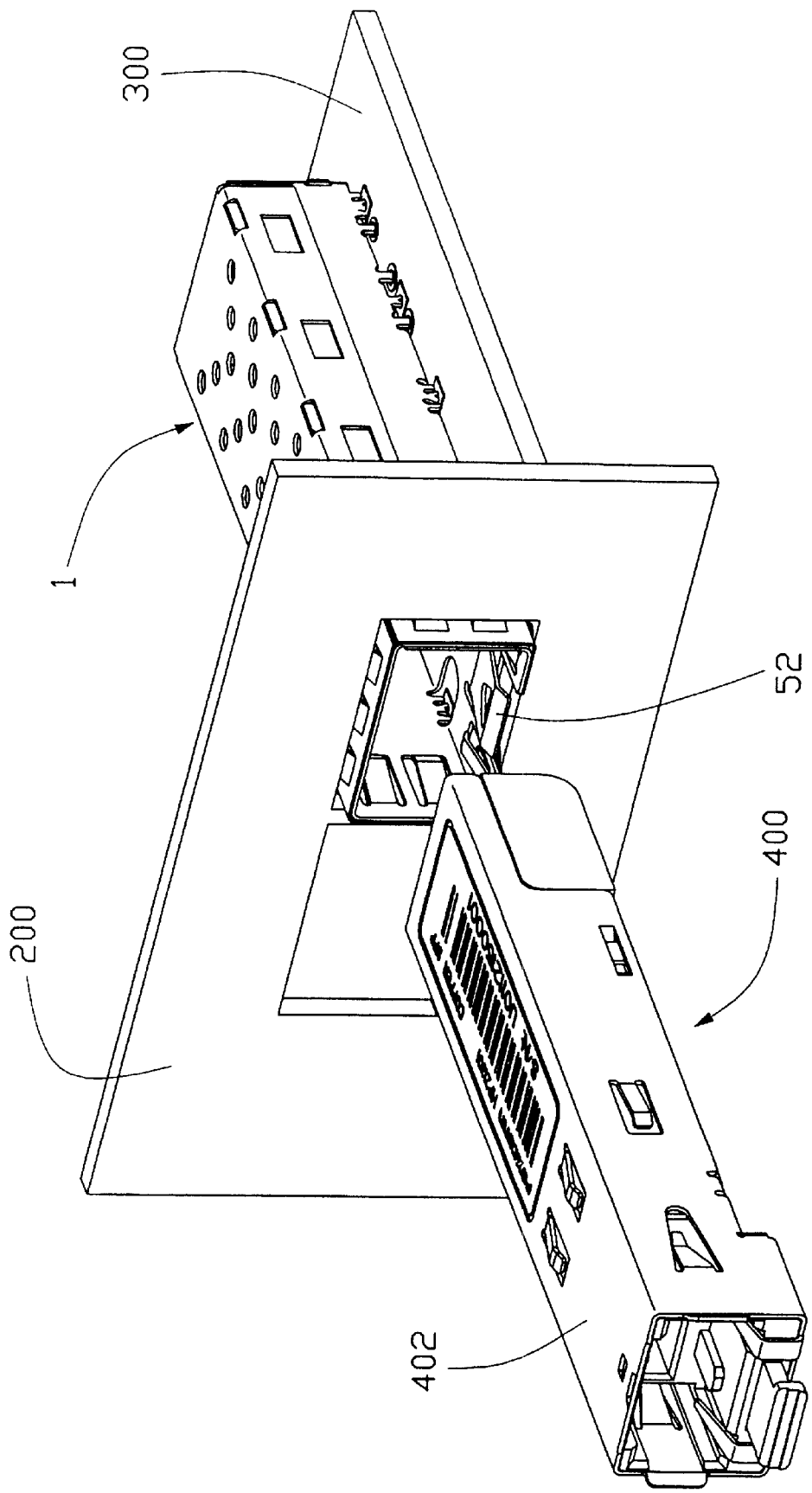
FIG. 10 views FIG. 6 with an SFP transceiver module out of the cage.
Figure 11:
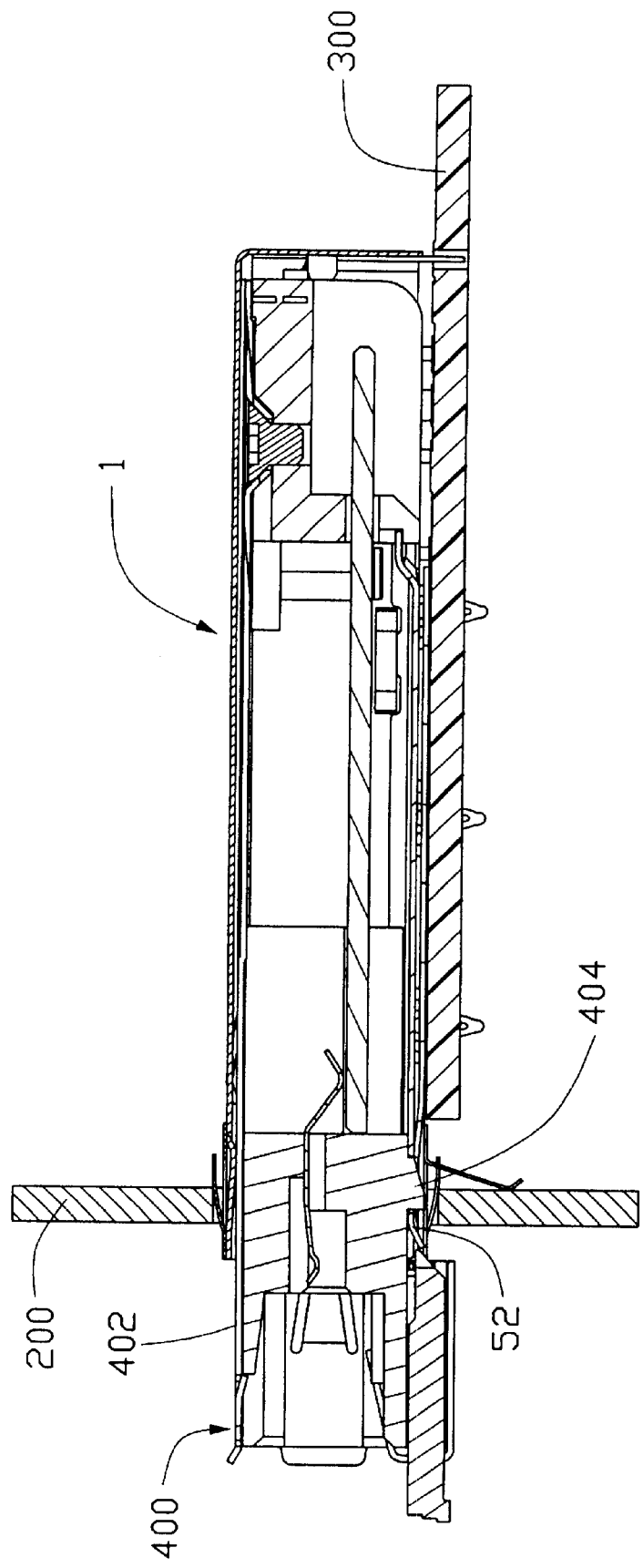
FIG. 11 is a cutaway view of FIG. 6 with an SFP transceiver module mounted therein.

Referring to FIGS. 10 and 11, an SFP transceiver module 400 mounted into the cage 1 having a conductive outer surface 402. A metal buckle 404 arranged on the module 400 so as to engage with the spring latch 52 on the cage 1. The inward grounding fingers 24, 41, 51*a*, 51*b* respectively of the sidewalls 2*a*, 2*b*, top plate 4 and bottom wall 5 project into a cavity (not labeled) formed by the cage 1, for contacting the conductive outer surface 402 of the SFP transceiver module 400. Thus the inward grounding fingers 24, 41, 51*a*, 51*b*, outward grounding fingers 912, 932, 952 and central outward spring tab 954 cooperate to establish multiple electrical paths between the SFP transceiver module 400, mainframe 10, grounding device 90 and panel 200. The cage 1 thereby provides multiple grounding paths to prevent EMI.

Figure 7:
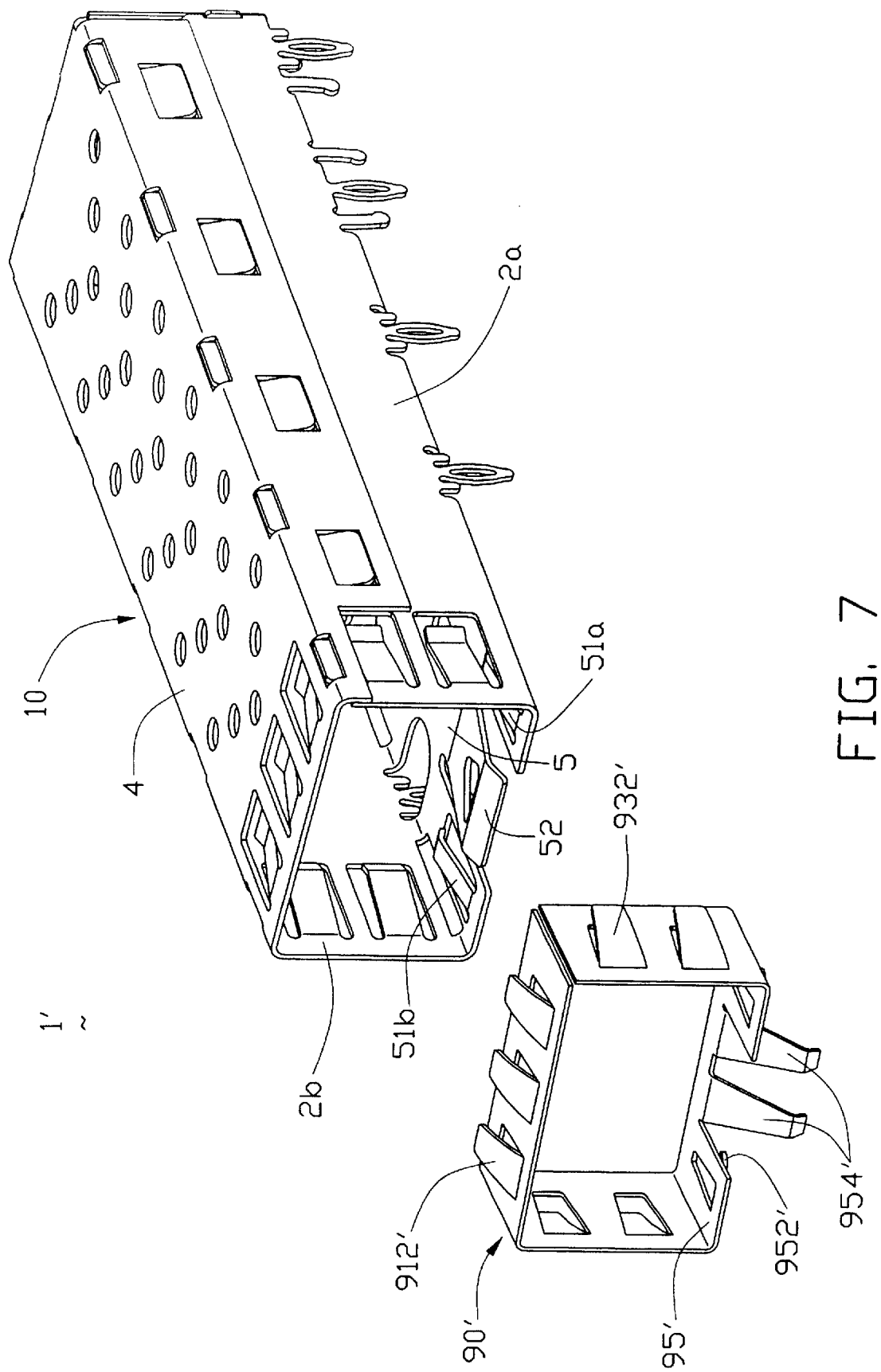
FIG. 7 is a exploded view of an SFP transceiver cage in accordance with an alternative embodiment of the present invention.
Figure 8:
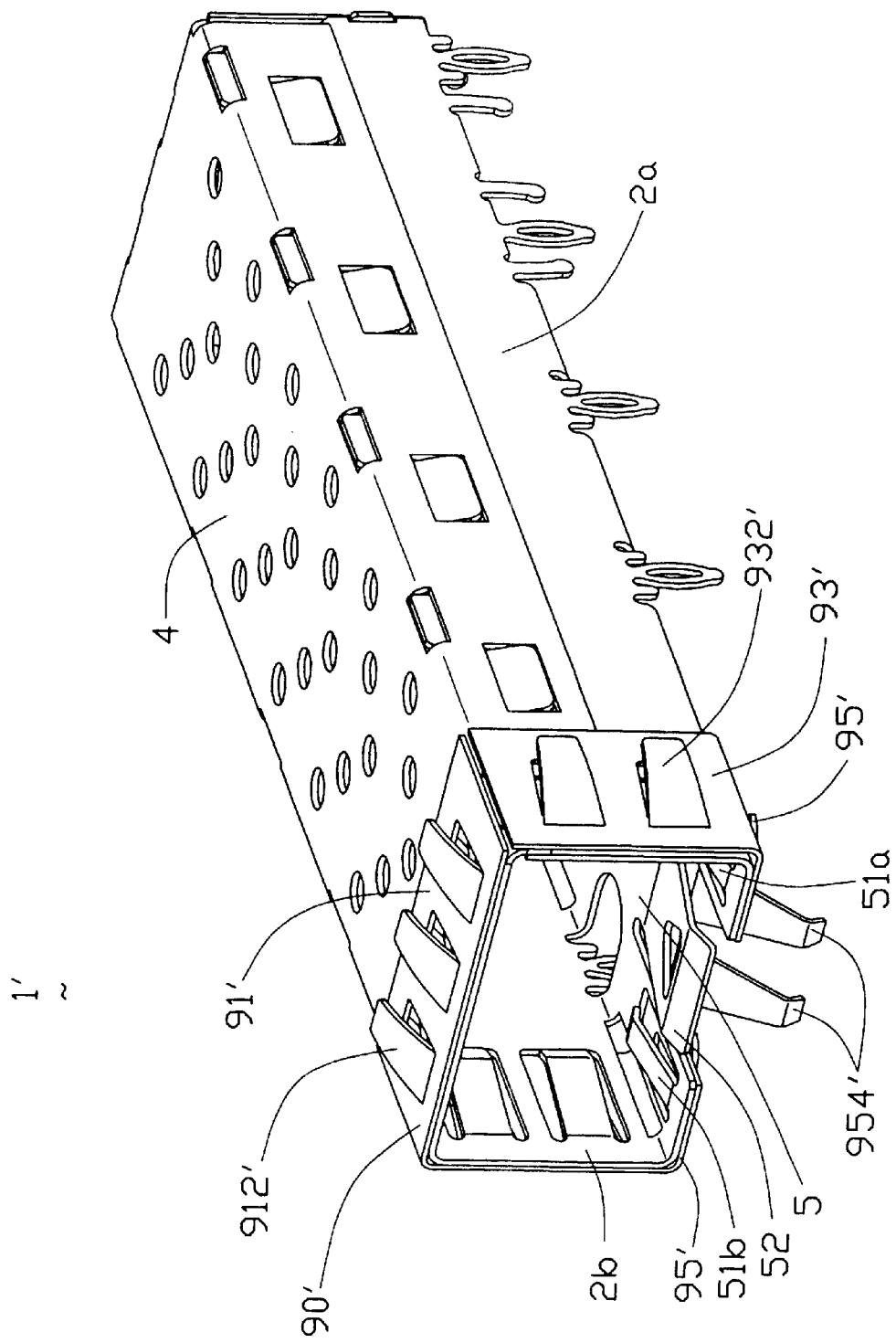
FIG. 8 is an assembled view of FIG. 7.
Figure 9:
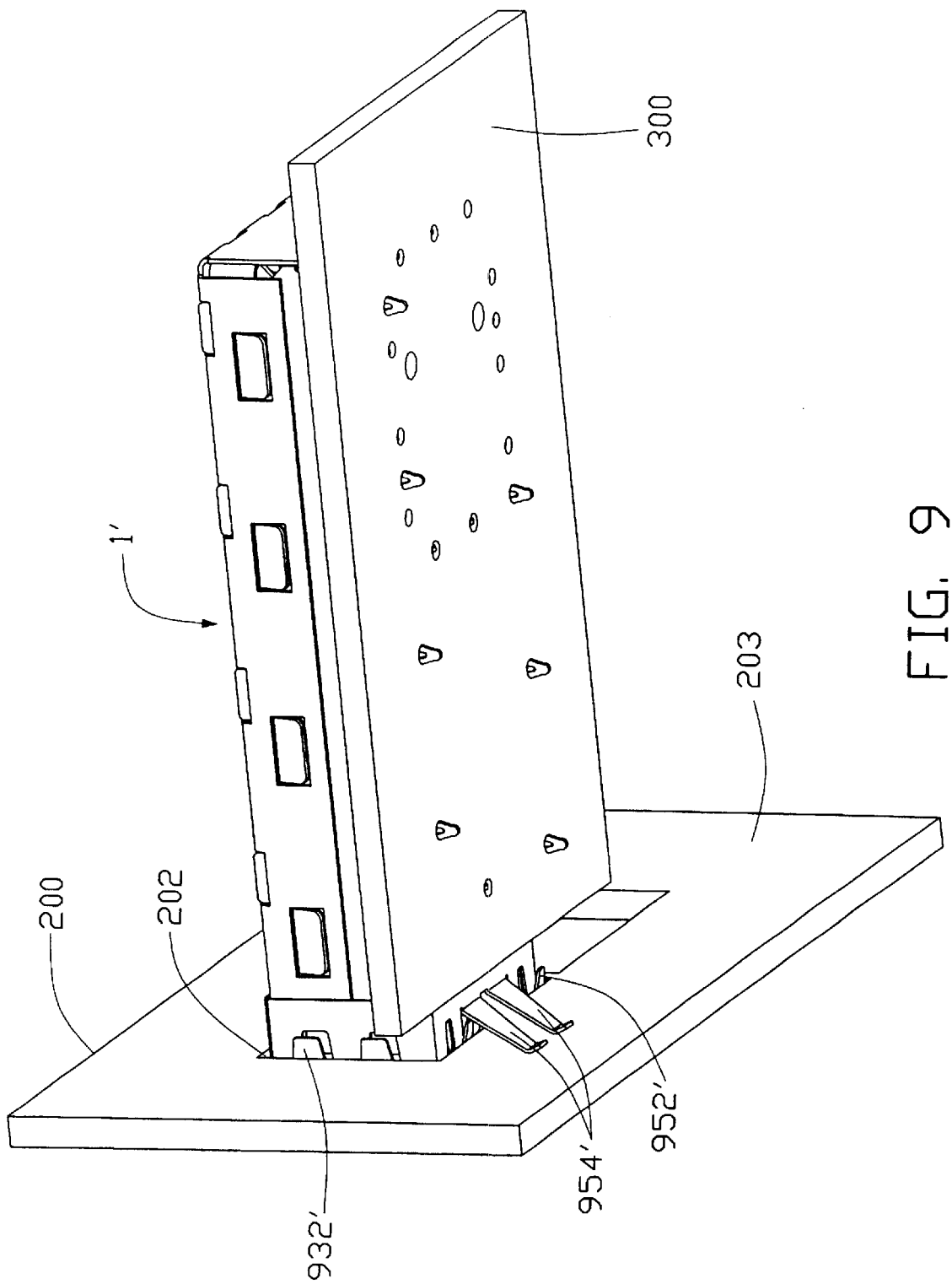
FIG. 9 shows the cage of FIG. 8 mounted on a printed circuit board, and further mounted in an opening of an orthogonal panel.

Referring back to FIGS. 7–9, an SFP transceiver cage 1' in accordance with an alternative embodiment of the present invention has a structure similar to that of the SFP transceiver cage 1 of the preferred embodiment. However, the cage 1' comprises a rectangular grounding device 90' instead of the grounding device 90 of the preferred embodiment. The grounding device 90' forms two central outward spring tabs 954' in a middle portion of a bottom plate 95' thereof. Two outward grounding fingers 952' are respectively disposed on opposite sides of the central outward spring tabs 954'. The grounding device 90' also has outward grounding fingers 912', 932'. Free ends of the central outward spring tabs 954' are disposed below a front of the cage 1'. The central outward spring tabs 954' resiliently abut against the inner face 203 of the panel 200. The inward grounding fingers 24, 41, 51*a*, 51*b* of the mainframe 10, outward grounding fingers 912', 932', 952' and central outward spring tab 954' cooperate to establish multiple electrical paths between the corresponding SFP transceiver module, mainframe 10, grounding device 90' and panel 200. The cage 1' thereby provides multiple grounding paths to prevent EMI.

In addition, the grounding device 90, 90' can be a grounding plate which defines a central outward spring tab in the middle and is only attached on the bottom wall 5. The grounding plate can also achieve the function of the grounding device 90, 90' respectively in the cage 1 and 1'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A small form-factor pluggable transceiver cage adapted to be mounted to a panel, the cage comprising:

a mainframe including a top plate, a bottom wall opposite to the top plate forming a spring latch, and first and second parallel sidewalls between the top plate and the bottom wall, the first sidewall integrally connected to the bottom wall, and the second sidewall integrally connected to both the bottom wall and the top plate, the mainframe further including a rear cover, and a sidewall cover depending from one edge of the top plate and at least partially overlapping the first sidewall;

a grounding device mounted to an entrance of the mainframe, the grounding device including at least one outward spring tab disposed below a spring latch of the mainframe and adapted to contact a face of the panel;

last line, the period has been changed to a semicolon and the following paragraphs have been inserted thereafter:

wherein the grounding device is dimensioned to closely fit over a front portion of the mainframe;

wherein the grounding device is made from a single piece of metallic material;

wherein the grounding device is spot welded to a front portion of the mainframe;

wherein the grounding device is hooked onto a front portion of the mainframe with at least one hook;

wherein the mainframe is made from a single piece of metallic material;

wherein a plurality of inward grounding fingers are formed on a front portion of the mainframe;

wherein the inward grounding fingers project into the cage for contacting a corresponding transceiver module, thereby providing multiple grounding paths and preventing electromagnetic interference.

* * * * *